United States Patent
Cope

(10) Patent No.: US 10,326,469 B1
(45) Date of Patent: Jun. 18, 2019

(54) SEGMENTED DIGITAL-TO-ANALOG CONVERTER (DAC)

(71) Applicant: QUALCOMM Incorporated, San Diego, CA (US)

(72) Inventor: William Cope, Maricopa, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/936,034

(22) Filed: Mar. 26, 2018

(51) Int. Cl.
H03M 3/00 (2006.01)
H03M 7/32 (2006.01)

(52) U.S. Cl.
CPC ......... *H03M 3/506* (2013.01); *H03M 7/3006* (2013.01); *H03M 3/422* (2013.01)

(58) Field of Classification Search
CPC .......................... H03M 3/506; H03M 7/3006
USPC ................................................. 341/143–144
See application file for complete search history.

(56) References Cited

U.S. PATENT DOCUMENTS

| | | | |
|---|---|---|---|
| 6,965,335 B1 | 11/2005 | Trotter et al. | |
| 7,714,758 B2 | 5/2010 | Ko et al. | |
| 8,786,477 B1 | 7/2014 | Albinet | |
| 9,048,863 B2 | 6/2015 | Kris et al. | |
| 10,020,817 B1 * | 7/2018 | Zhang | H03M 3/502 |
| 2006/0251197 A1 * | 11/2006 | Zaucha | H04S 3/008 |
| | | | 375/350 |
| 2009/0251346 A1 * | 10/2009 | Kwan | H03M 3/416 |
| | | | 341/143 |
| 2010/0131276 A1 * | 5/2010 | Den Brinker | G10L 13/033 |
| | | | 704/262 |
| 2015/0091376 A1 * | 4/2015 | Kim | B60R 16/03 |
| | | | 307/9.1 |
| 2018/0145697 A1 * | 5/2018 | Crespi | G06F 3/165 |

OTHER PUBLICATIONS

Chen Z-Y., et al., "DLL-Based Pulse-Width Modulation Digital-to-Analog Converter for Continuous-Time Sigma Delta Modulators", IEEE, International Midwest Symposium on Circuits and Systems (MWSCAS), 2014, pp. 757-760.

Sun N., "High-Order Mismatch-Shaped Segmented MULTIBIT $\Delta\Sigma$ DACs With Arbitrary Unit Weights", IEEE Transactions on Circuits and Systems—I: Regular Papers, vol. 59, No. 2, Feb. 2012, pp. 295-304.

Welz J., et al., "Simplified Logic for First-Order and Second-Order Mismatch-Shaping Digital-to-Analog Converters", IEEE Transactions on Circuits and Systems—II: Analog and Digital Signal Processing, vol. 48, No. 11, Nov. 2001, pp. 1014-1027.

* cited by examiner

Primary Examiner — Lam T Mai
(74) Attorney, Agent, or Firm — Patterson & Sheridan, L.L.P.

(57) ABSTRACT

Certain aspects of the present disclosure provide apparatus and techniques for segmenting a digital input signal for digital-to-analog conversion. For example, certain aspects provide a segmentation circuit for generating digital signal segments for a digital-to-analog converter. The segmentation circuit generally includes a modulo function logic circuit configured to generate a modulo output signal based on a digital input signal and a divisor input signal and a modulo range extension logic circuit configured to selectively direct the modulo output signal or the divisor input signal to an output of the segmentation circuit. In certain aspects, the output of the segmentation circuit may be used by the digital-to-analog converter to generate an analog signal based on the digital input signal.

29 Claims, 7 Drawing Sheets

SEGMENTED DIGITAL-TO-ANALOG CONVERTER (DAC)

TECHNICAL FIELD

Certain aspects of the present disclosure generally relate to electronic circuits and, more particularly, to a digital-to-analog converter (DAC).

BACKGROUND

Audio systems may be implemented using digital signal processors (DSPs) that receive and process digital audio signals with an aim to improve audio quality. The processed digital signal generated by the DSP is output to a digital-to-analog converter (DAC) for conversion to an analog audio signal before being provided to a speaker for the generation of sound waves. For example, the analog audio signal may be amplified using a power amplifier (PA), which increases the power level of the analog audio signal to sufficiently drive the speaker.

SUMMARY

Certain aspects of the present disclosure provide apparatus and techniques for segmenting a digital input signal for digital-to-analog conversion.

For example, certain aspects provide a segmentation circuit for generating digital signal segments for a digital-to-analog converter. The segmentation circuit generally includes a modulo function logic circuit configured to generate a modulo output signal based on a digital input signal and a divisor input signal and a modulo range extension logic circuit configured to selectively direct the modulo output signal or the divisor input signal to an output of the segmentation circuit. In certain aspects, the output of the segmentation circuit may be used by the digital-to-analog converter to generate an analog signal based on the digital input signal.

Certain aspects of the present disclosure provide a digital-to-analog converter. The digital-to-analog converter generally includes a segmentation circuit configured to receive a digital input signal to be converted to an analog signal and generate multiple digital signal segments based on the digital input signal; at least one pulse-density modulation encoder and at least one pulse-width modulation encoder coupled to outputs of the segmentation circuit; and a plurality of digital-to-analog converter elements, wherein the pulse-density modulation encoder and pulse-width modulation encoder are coupled to the digital-to-analog converter elements and are configured to generate encoded signals based on the multiple digital signal segments and to provide the encoded signals to the digital-to-analog converter elements, the digital-to-analog converter elements being configured to generate the analog signal.

Certain aspects of the present disclosure provide a method for digital-to-analog conversion. The method generally includes generating a first modulo output signal based on a digital input signal and a divisor input signal, selecting the first modulo output signal or the divisor input signal, generating a digital signal segment corresponding to the digital input signal from the selected signal, and generating an analog signal based on the digital signal segment.

Certain aspects of the present disclosure provide a method for digital-to-analog conversion. The method generally includes selectively enabling a pulse-density modulation encoding circuit or a pulse-width modulation encoding circuit, generating multiple digital signal segments based on a digital input signal, encoding the digital signal segments via the enabled encoding circuit, and converting the digital input signal to an analog signal based on the encoded digital signal segments.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
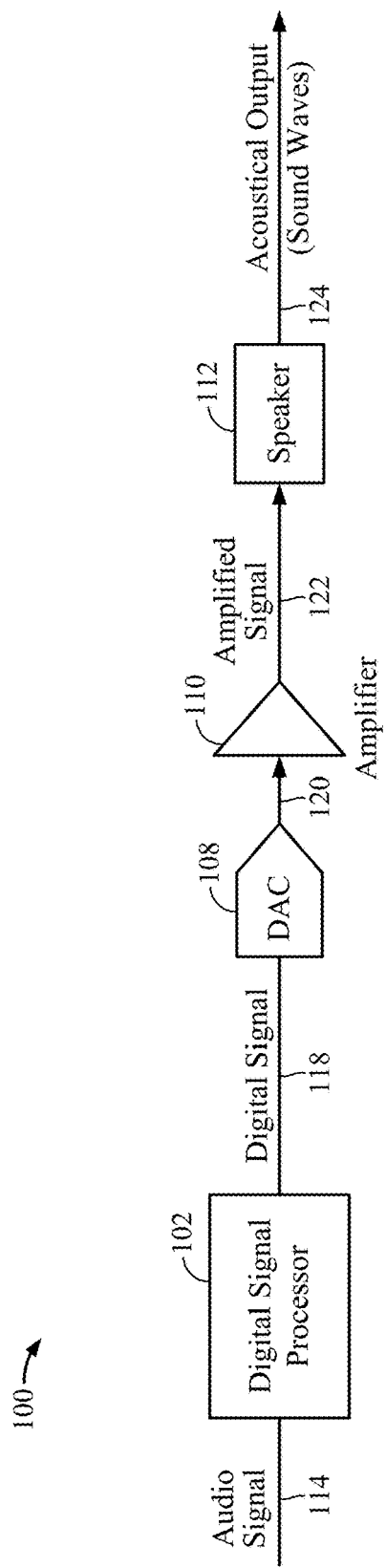
FIG. 1 is a diagram of an example audio amplifier system, in accordance with certain aspects of the present disclosure.

FIG. 1 illustrates an example audio amplifier system 100, in accordance with certain aspects of the present disclosure. As illustrated, a digital signal processor (DSP) 102 may receive and process audio signals 114 (e.g., a digital audio signal) by applying a digital filter aimed at increasing audio quality. The filtered digital signal 118 produced by the DSP (or a further processed version thereof) may be converted to an analog signal 120 using a digital-to-analog converter (DAC) 108. In certain aspects of the present disclosure, the DAC 108 may be high bit-width DAC and may be implemented as a segmented DAC to reduce the number of DAC elements used to convert the digital signal 118 to the analog signal 120. High bit-width DACs (e.g., for audio headsets) may use a large number of elements (e.g., current sources) to represent the quantization of the DAC. For example, the DAC may use $2^n$ number of elements, where n is the number of bits of the DAC. Therefore, in certain aspects, the digital signal 118 may be segmented, with each segment being provided to DAC elements having different magnitudes (gains). Segmentation of the digital signal 118 for the DAC 108 allows for high-bit quantizers to be implemented using a lower number of DAC elements, as will be described in more detail herein.

In certain aspects, the analog signal 120 may be amplified using amplifier 110 to generate the amplified signal 122. The amplified signal 122 may drive a speaker 112 to produce an acoustic output (e.g., sound waves) 124. While FIG. 1 provides an example audio amplifier system as an example application in which certain aspects of the present disclosure may be implemented to facilitate understanding, certain aspects provided herein can be implemented in any of various other suitable systems to convert a digital signal to an analog signal.

In certain aspects, the digital segments generated based on the digital signal (e.g., digital signal 118) may be converted to thermometer-type code and encoded in a manner as to cancel (or at least reduce) noise and distortion that may be caused by inter-segment and/or intra-segment mismatch. Pulse-density modulation (PDM) and pulse-width modulation (PWM) are two different techniques for performing digital-to-analog conversion encoding. PDM can contribute to inter-symbol interference (ISI), while PWM mitigates ISI.

As presented above, segmentation of the digital input allows different bits of the digital input to be converted using DAC elements having different magnitudes. Thus, certain digital signal segments can be converted to analog signals using DAC elements having higher magnitudes, which can represent more bits as compared to DAC elements having lower magnitudes. Therefore, by segmenting the digital input and using higher magnitude DAC elements for certain segments, the total number of DAC elements used to convert the digital input to an analog output is reduced. Certain aspects of the present disclosure provide techniques for segmenting the digital input in a manner that is compatible with both PDM encoding and PWM encoding, allowing the type of conversion (PDM and/or PWM) to be selected dynamically.

The PDM and PWM encoding may be implemented using different noise shaping techniques. For example, PDM encoding may be implemented with dynamic element matching (DEM) to compensate, or at least adjust, for noise caused by inter-segment mismatch. In some cases, DEM may be implemented using a Galton tree technique to shape the noise caused by inter-segment mismatch, such that the noise is shifted out of the bandwidth of interest (e.g., shifted outside the audio band such that is does not impact audio quality). Moreover, PWM encoding may be implemented to compensate, or at least adjust, for noise caused by intra-segment mismatch. PWM encoding may be implemented at higher frequencies and has higher power consumption as compared to PDM with DEM.

Figure 2A:
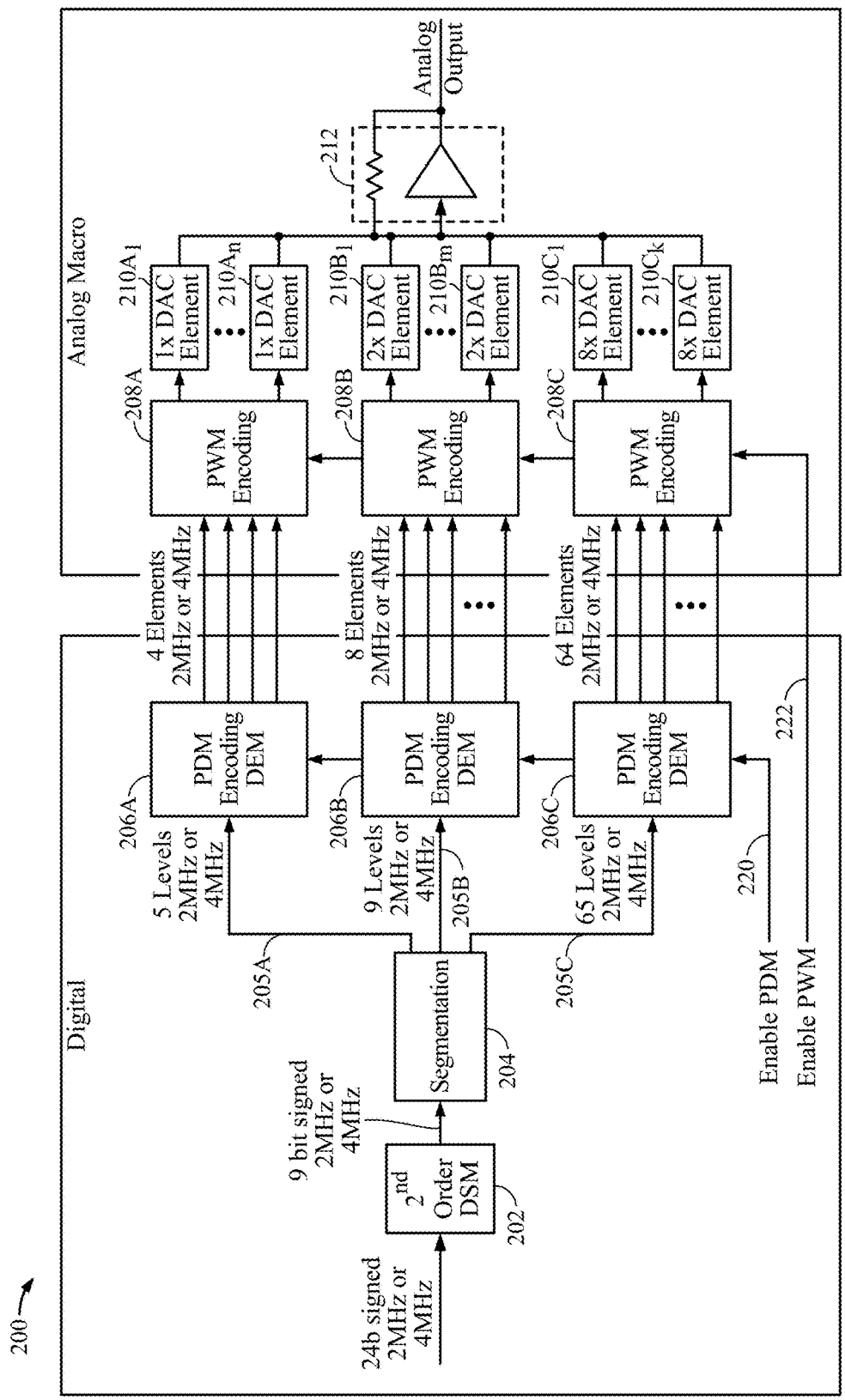
FIG. 2A is a block diagram of an example segmented digital-to-analog converter (DAC), in accordance with certain aspects of the present disclosure.

FIG. 2A is a block diagram of an example segmented DAC 200, in accordance with certain aspects of the present disclosure. In certain aspects, the segmented DAC 200 may correspond to the DAC 108 as described with respect to FIG. 1. The segmented DAC 200 may include a second-order delta-sigma modulator (DSM) 202 that may receive a relatively higher-bit digital signal (e.g., a 24-bit signed digital signal) and provide a relatively lower-bit digital signal (e.g., a 9-bit signed digital signal) to a segmentation circuit 204. The DSM may be configured to operate at, for example, 2 MHz or 4 MHz depending on the power and performance specifications of the DAC 200.

The segmentation circuit 204 may generate multiple digital signal segments 205A, 205B, and 205C (collectively referred to as digital signal segments 205) from the 9-bit signed digital signal. The digital signal segments 205 are then provided to PDM encoders and PWM encoders, which may encode the digital segments as previously described and provide the encoded signals to the DAC elements. In certain aspects, the PDM encoder may use DEM to compensate, or at least adjust, for noise caused by inter-segment mismatch. In some cases, the 9-bit signed digital signal may be split into three segments, each segment being provided to one of the PDM encoders 206A, 206B, and 206C (collectively referred to as "PDM encoders 206"), and one of the PWM encoders 208A, 208B, and 208C (collectively referred to as "PWM encoders 208"). In certain aspects, each of the digital signal segments 205 may be a multi-bit digital signal. For example, the digital signal segment 205A may have five levels (e.g., representing the five values −2, −1, 0, 1, and 2), the digital signal segment 205B may have 9 levels, and the digital signal segment 205C may have 65 levels. Each of the digital signal segments 205 may be represented by a number of elements. For example, the five levels of the digital signal segment 205A may be represented by four elements (e.g., all four elements may be logic low, one of the four elements may be logic high, two of the four elements may be logic high, and so on for a total of five possible states (levels) corresponding to the four elements).

As illustrated, the encoded signals generated by the PDM encoder 206A or PWM encoder 208A may be provided to the DAC elements $210A_1$ to $210A_n$. For example, the encoded signals generated by the PDM encoder 206A may be provided to the DAC elements $210A_1$ to $210A_n$ through the PWM encoder 208A. The PWM encoder 208A may further process the encoded signals received from the PDM encoder 206A when enabled, or pass through the encoded signals to the DAC elements $210A_1$ to $210A_n$ when disabled. The encoded signals generated by the PDM encoder 206B or PWM encoder 208B may be provided to the DAC elements $210B_1$ to $210B_m$, each having a magnitude (gain) that is twice the magnitude of each the DAC elements $210A_1$ to $210A_n$. Moreover, the encoded signals generated by the PDM encoder 206C and/or PWM encoder 208C may be provided to the DAC elements $210C_1$ to $210C_k$, each having a magnitude that is eight times the magnitude of each the DAC elements $210A_1$ to $410A_n$. Therefore, instead of having 512 DAC elements each having a gain of 1× to convert a 9-bit digital input, the 9-bits are converted in the segmented DAC 200 using four 1× DAC elements, eight 2× DAC elements, and sixty-four 8× DAC elements, for a total of seventy-six DAC elements, representing about an 85% decrease in the total number of DAC elements used.

Figure 2B:
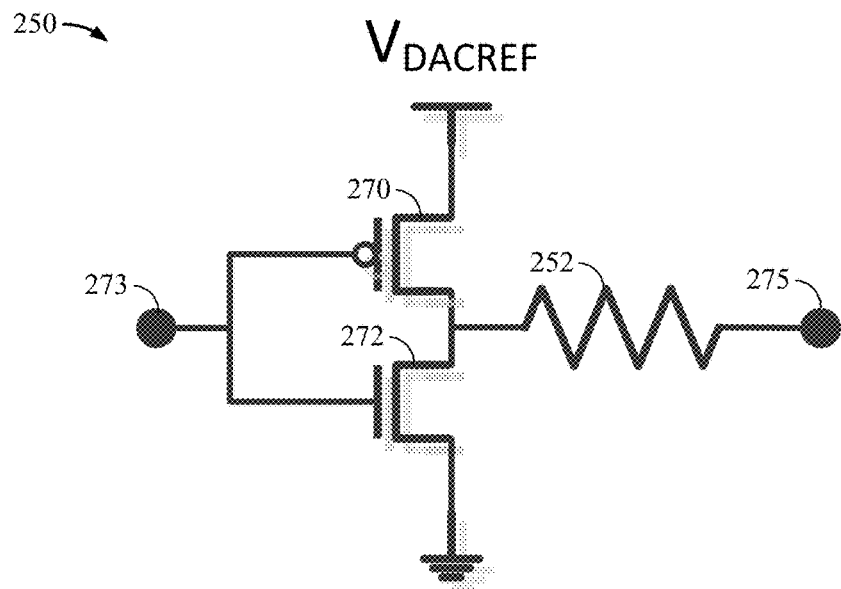
FIGS. 2B and 2C illustrate example DAC elements, in accordance with certain aspects of the present disclosure.
Figure 2C:
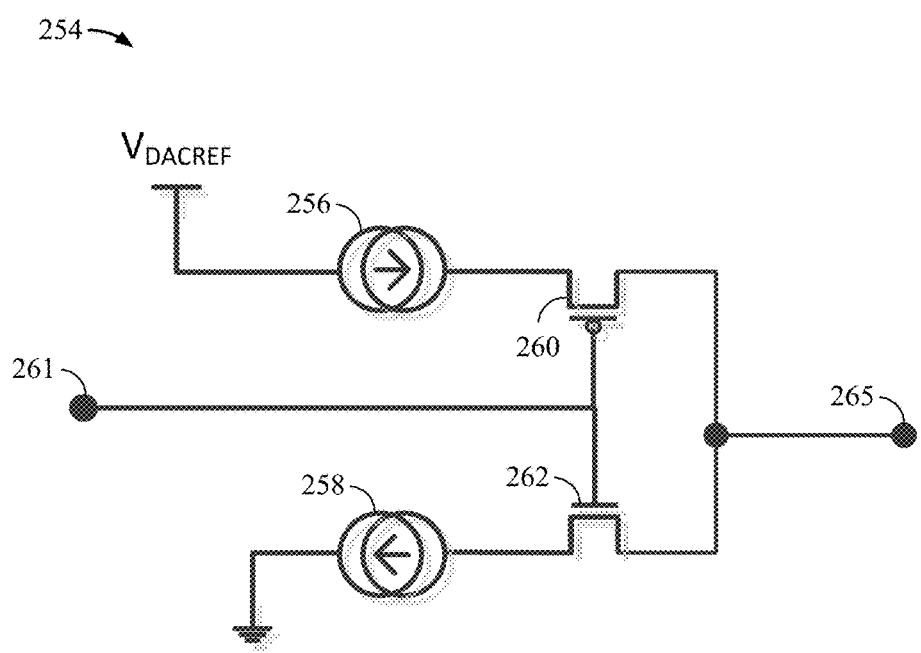

FIGS. 2B and 2C illustrates example DAC elements implemented using a flip-flop resistor and a current-steering topology, respectively, in accordance with certain aspects of the present disclosure. For example, the DAC element 250 of FIG. 2A is implemented using a flip-flop resistor topology and includes transistors 270 and 272 in a complementary metal-oxide semiconductor (CMOS) structure having gates coupled to an input node 273. Depending on the signal at the input node 273, either current is sourced from the reference voltage node ($V_{DACREF}$) to the output node 275 through the transistor 270 and the resistive element 252, or sunk from the output node 275 through the resistive element 252 and the transistor 272 to the reference potential (e.g., electric ground), as illustrated. The DAC elements 254 of FIG. 2C is implemented using a current-steering topology and includes transistors 260 and 262 having gates coupled to an input node 261. Depending on the signal at the input node 261, either current is sourced by the current source 256 to the output node 265 through the transistor 260, or sunk from the output node 265 through the transistor 262 to the reference potential (e.g., electric ground) by the current source 258, as illustrated. In certain aspects, each of the DAC elements may be implemented using a flip-flop resistor or a current-steering topology as described with respect to FIGS. 2A and 2B. Returning to FIG. 2A, the analog output signals (e.g., currents) provided by the DAC elements may be provided to a summing amplifier 212 configured to sum the analog output signals from the DAC elements and provide an analog output signal for the segmented DAC 200, as illustrated.

In certain aspects of the present disclosure, the segmentation circuit 204 may be implemented in a manner that allows for dynamic selection of the size of each segment, allowing for encoding by either the PDM encoders 206 or the PWM encoders 208. Thus, the segmentation as described herein allows the PDM encoders 206 or the PWM encoders 208 to be dynamically enabled as operationally desired using one or more enable signals. For example, the PDM encoders 206 may receive an enable DEM signal 220 to enable the PDM encoders 206, and the PWM encoders 208 may receive an enable PWM signal 222 to enable the PWM encoders 208. The selection of PDM or PWM encoding may be based on a trade-off between power consumption and the desired level of noise compensation. In certain aspects, the PDM and PWM encoders 206 and 208 may be configured to pass-through their respective inputs to their respective outputs when disabled. For example, the PDM encoders 206, when disabled, may provide signals corresponding to the digital segments 205 to the PWM encoders 208 via signal paths between the PDM encoders 206 and PWM encoders 208. The PWM encoders 208, when disabled, may provide signals corresponding to the encoded signals generated by the PDM encoders 206 to the DAC elements via the signal paths between the PDM encoders 206 and the PWM encoders 208. For example, the PWM encoders may pass-through the outputs of the PDM encoders 206 to the DAC elements when disabled.

Figure 3:
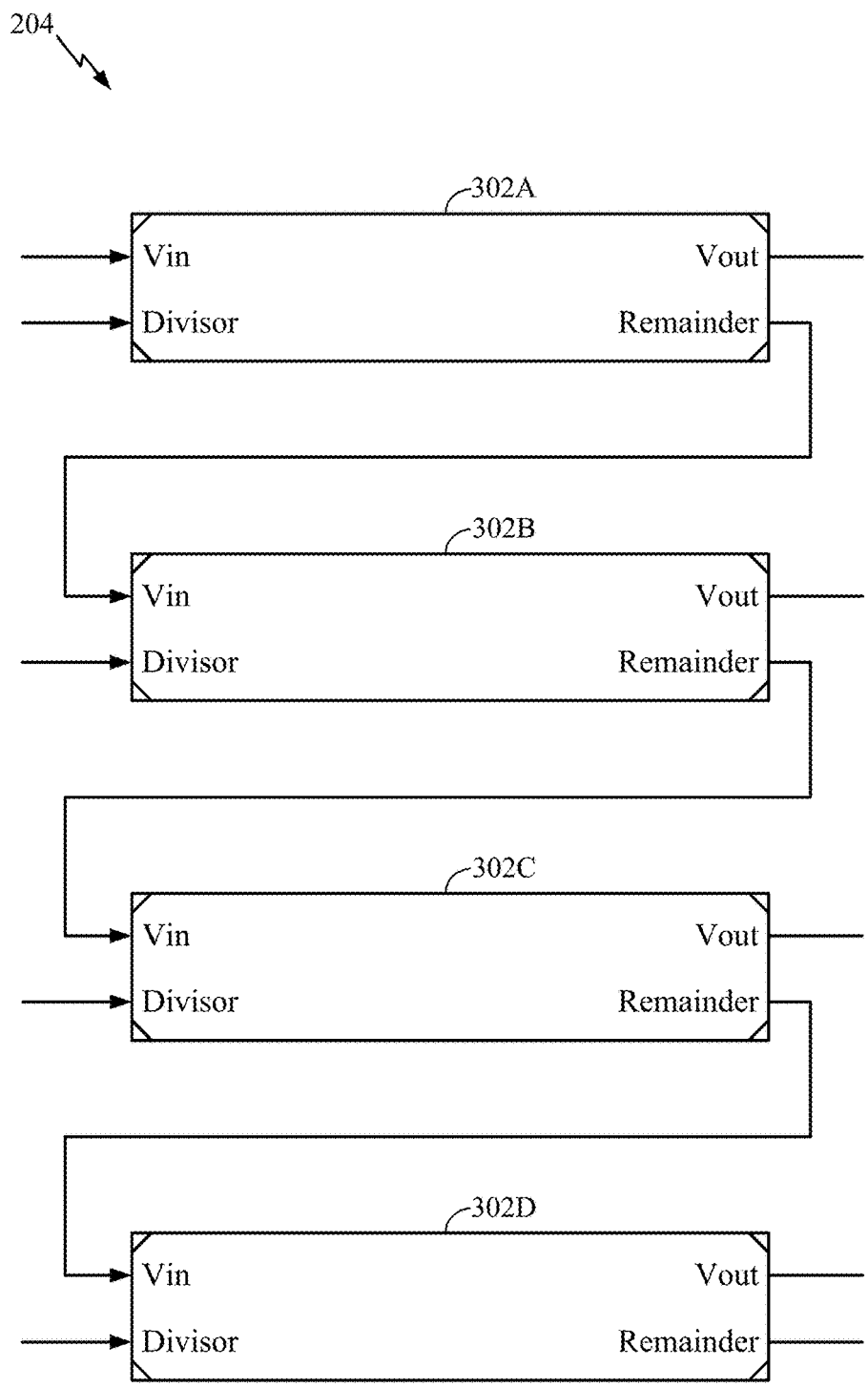
FIG. 3 is a block diagram of an example segmentation circuit having multiple segmentation modules, in accordance with certain aspects of the present disclosure.

FIG. 3 illustrates an example implementation of the segmentation circuit 204, in accordance with certain aspects of the present disclosure. The segmentation circuit 204 may include one or more segmentation modules, each configured to receive a digital input signal at an input node Vin and a divisor input signal, and provide a segmentation output signal at an output node Vout and a remainder signal. For example, in this case, the segmentation circuit 204 may include segmentation modules 302A, 302B, 302C, and 302D (collectively referred to as "segmentation modules 302"). The segmentation modules 302 may be daisy chained, as illustrated. For example, the remainder output of the segmentation module 302A may be routed to the input node Vin of the segmentation module 302B, and so on.

If only two segments are desired, the segmentation output signal at Vout and the remainder signal of the segmentation module 302A represent the two desired segments. If more segments are desired, the remainder signal generated by the segmentation module 302A may be provided to a digital input of the segmentation module 302B for further segmentation, as illustrated. For example, if three segments are desired, the segmentation output signal at Vout of the segmentation module 302A may be used as the first segment, the segmentation output signal at Vout of the segmentation module 302B may be used as the second segment, and the remainder signal provided by the segmentation module 302B may be used as the third segment.

A quantity of the first subset of the digital-to-analog converter elements corresponds to the divisor input signal and a gain of each of the second subset of the digital-to-analog converter elements corresponds to the divisor input signal. That is, the value of the divisor input signal may influence the number of elements of a segment and the gain between the segment and a subsequent segment. For example, when the divisor value used to generate a segment is two, there may be a total of four DAC elements for the segment, and the gain of a DAC element for the subsequent segment may be four times the gain of a DAC element of the current segment. In other words, the sum of the gains of the DAC elements for the current segment may be equal to the gain of one DAC element for the following segment. Thus, the gain of the DAC elements of the subsequent segment may be set based on the divisor value used to generate the digital segments of the current segment. In some cases, a greater number of DAC elements may be used for a segment to allow for more flexibility when performing noise shaping. For example, as opposed to having a total of four DAC elements for the segment as described above, eight DAC elements may be implemented for the segment instead. In this case, any four of the eight DAC elements of the segment may be selected to correspond to one of the DAC elements of the subsequent segment, increasing flexibility when performing noise shaping.

Figure 4:
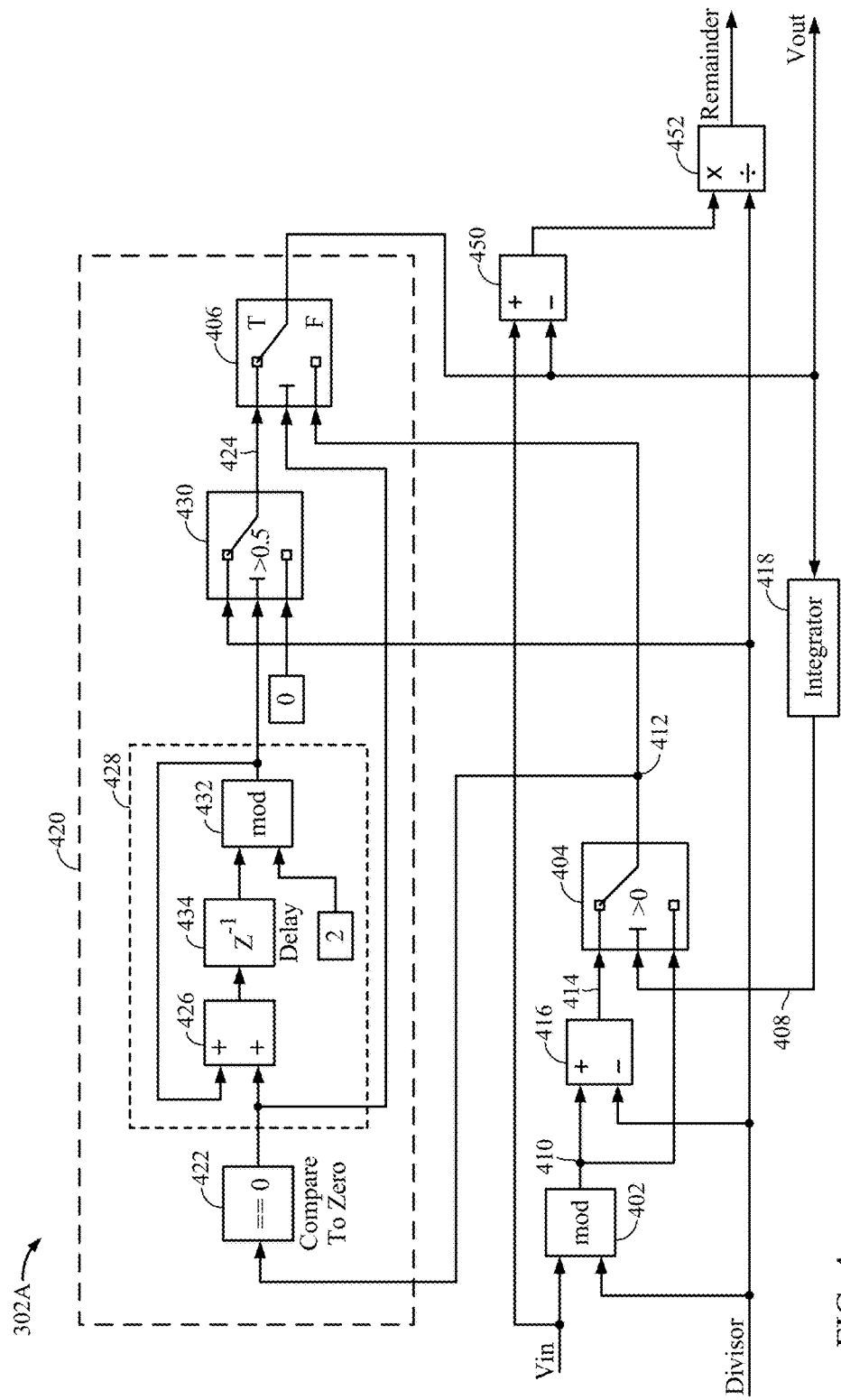
FIG. 4 is a block diagram of an example segmentation module of the segmentation circuit of FIG. 3, in accordance with certain aspects of the present disclosure.

FIG. 4 is a block diagram of an example segmentation module (e.g., segmentation module 302A), in accordance with certain aspects of the present disclosure. As illustrated, the digital input signal at Vin and the divisor input signal are provided to a modulo function logic circuit 402. In certain aspects, the digital input signal at Vin and the divisor input signal may be multi-bit digital signals representing a digital input value and a divisor value, respectively. Given the values of the digital input signal at Vin and the divisor signal, the modulo function logic circuit 402 provides the remainder (e.g., a multi-bit digital signal representing a remainder value) from the division of the value of the digital input signal by the value of the divisor input signal. For example, where the digital input signal is 9-bits and has a value of thirteen and the divisor value is two, the modulo function logic circuit 402 provides an output signal having a value of one.

The output signal provided by the modulo function logic circuit 402 at node 410 is either provided to the output node Vout, or further processed, depending on the state of switches 404 and 406. The output signal at the output node Vout may be a multi-bit digital signal representing a digital signal segment corresponding to the digital input signal. When the control input node 408 of switch 404 is less than or equal to zero, the node 412 is coupled to node 410 by switch 404. However, when the control input node 408 of switch 404 is greater than zero, the node 412 is coupled to node 414 such that the adder 416 is incorporated in the path between nodes 410 and 412. When the output node Vout of the segmentation module 302A is coupled to node 412 via switch 406, the node 410 may be coupled to the output node Vout either by bypassing the adder 416 or through the adder 416. Thus, the adder 416 is selectively incorporated in the path between nodes 410 and 412 by switch 404, which is controlled by an integrator 418 to provide noise shaping for the digital segment generated by the segmentation module 302A. For example, depending on whether the integral of the signal at the output node Vout is above or below zero, the integrator 418 switches the output signal of the segmentation module 302A between mod(vin, divisor) and mod(vin, divisor)-divisor, which keeps the integrator output close to zero, and allows for signed inputs and outputs.

In certain aspects, the segmentation module 302A may include a modulo range extension logic circuit 420. The modulo range extension logic circuit 420 accommodates a shortcoming of the modulo function logic circuit 402. The modulo function logic circuit 402 and adder 416 are capable of providing a segmentation output signal that can range from the negative divisor value to the divisor value −1. Thus, without the modulo range extension logic circuit 420, the modulo function logic circuit 402 and adder 416 are unable to generate the segmentation output signal having a value equal to the positive divisor value.

The modulo range extension logic circuit 420 is configured to direct the divisor input signal, instead of the signal at node 412, to the output node Vout every other time the signal at node 412 is equal to zero, allowing the segmentation output signal at the output node Vout to span the full range from the negative divisor value to the positive divisor value. For example, the modulo range extension logic circuit 420 may include a comparison circuit 422 for comparing the signal at node 412 to zero. If the signal at node 412 is not equal to zero, the output of the comparison circuit 422 sets the state of switch 406 to false ("F") such that the output node Vout is coupled to node 412, or otherwise, to node 424 at the output of switch 430 when the state of switch 406 is true ("T").

As illustrated, the modulo range extension logic circuit 420 includes a control circuit 428 for controlling the state of switch 430. The switch 430 directs either a value of zero or the divisor input signal to node 424 depending on the control input provided by the control circuit 428. For example, when the control input of switch 430 is set to a value that is greater than 0.5, the switch 430 directs the divisor input signal to node 424, or otherwise, directs the value 0 to node 424. The control circuit 428 flips the state of the switch 430 every other time the value at node 412 is equal to zero as determined by the comparison circuit 422. In this manner, the modulo range extension logic circuit 420 directs the divisor input signal, instead of the value zero, to the output node Vout every other time the signal at node 412 is equal to zero.

In certain aspects, the control circuit 428 may include an adder 426 configured to sum the value output by the comparison circuit 422 (e.g., true=1 and false=0) and a value output by a modulo function logic circuit 432, as illustrated. The modulo function logic circuit 432 provides the remainder of a division by two of the value output by the adder 426, received through a delay element 434. Thus, the output of the modulo function logic circuit 432 flips between values zero and one, every time the signal at node 412 is equal to zero. For example, assuming the output of the modulo function logic circuit 432 is equal to zero, when the output of the comparison circuit 422 is equal to one, the adder 426 provides a value of one to the input of the modulo function logic circuit 432. Since one modulo two is equal to one, the switch 430 will be set such that the signal at node 424 is equal to the value of the divisor input signal, allowing the segmentation output signal at Vout to span the full range from the negative divisor value to the positive divisor value.

During a subsequent occasion when the output of the comparison circuit 422 is equal to one, the adder 426 may provide a value of two because the output of the modulo function logic circuit 432 is now set to one. Thus, the value of two is provided to the input of the modulo function logic circuit 432, and since two modulo two provides a modulo output equal to zero, the switch 430 will now be set such that the signal at node 424 is equal to zero. In this manner, the control circuit 428 controls the switch 430 such that the divisor input signal is directed to node 424 at most once across two consecutive sampling periods of the digital-to-analog converter.

In certain aspects, the segmentation module 302A may include a subtraction circuit 450 and a divider 452, which are used to generate the remainder signal. For example, the subtraction circuit 450 subtracts the value of the output signal at Vout from the digital input signal at Vin. The output of the subtraction circuit 450 is then provided to the divider 452, which divides the output signal provided by the subtraction circuit 450 by the divisor input signal and generates the remainder signal, as illustrated. As described with respect to FIG. 3, if only two segments are desired, the segmentation output signal at Vout and the remainder signal of the segmentation module 302A represent the two desired segments. If more segments are desired, the remainder signal generated by the segmentation module 302A may be provided to a digital input of the segmentation module 302B for further segmentation.

Figure 5:
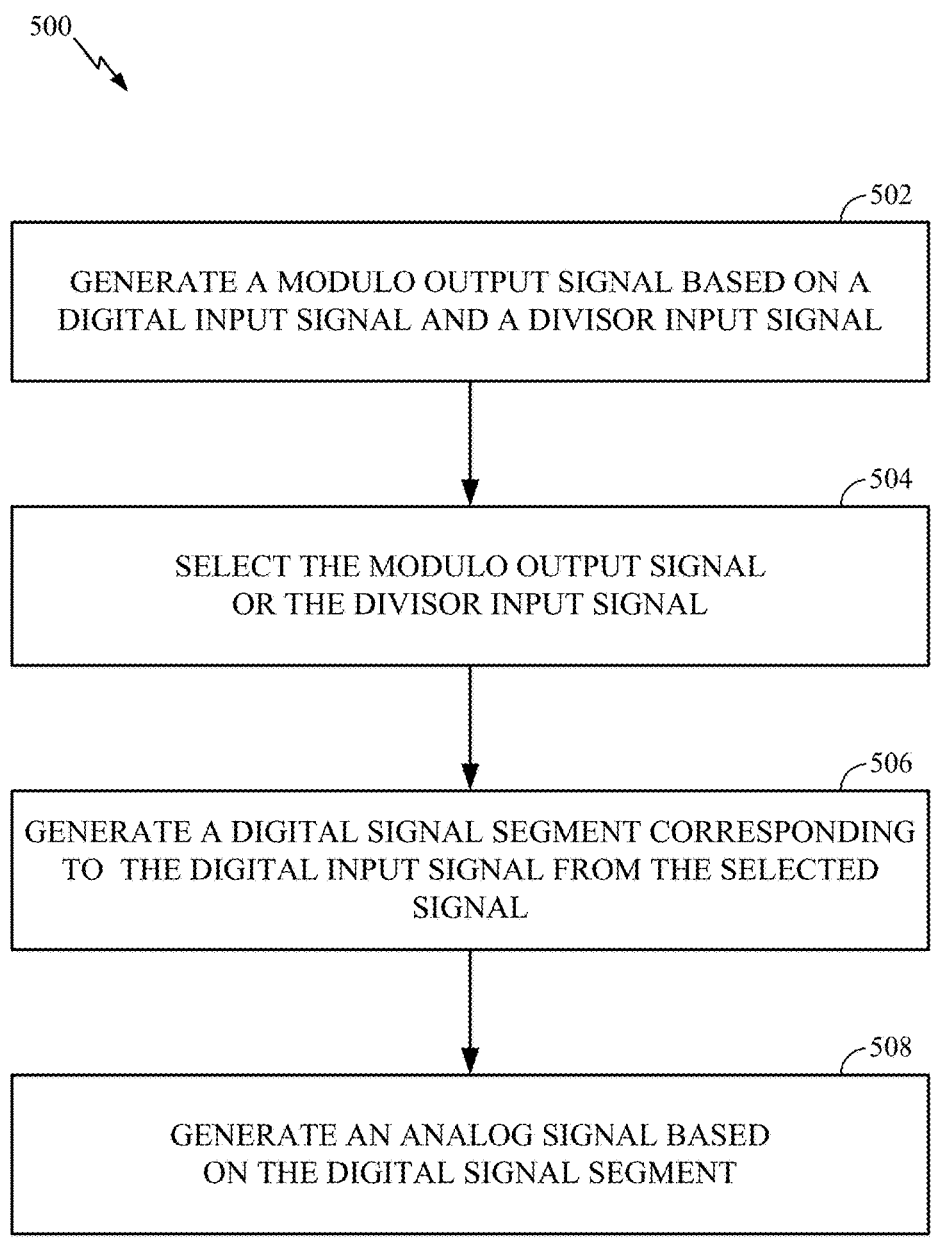
FIG. 5 is a flow diagram of example operations for generating digital signal segments, in accordance with certain aspects of the present disclosure.

FIG. 5 is a flow diagram of example operations 500 for digital-to-analog conversion, in accordance with certain aspects of the present disclosure. The operations 500 may be performed by a segmented DAC having a segmentation circuit, such as the DAC 200 having the segmentation circuit 204 as described with respect to FIGS. 2, 3 and 4.

The operations 500 may begin, at block 502, by generating a first modulo output signal (e.g., via the modulo function logic circuit 402) based on a digital input signal and a divisor input signal, and at block 504, selecting (e.g., via the switches 406 and 430) the first modulo output signal or the divisor input signal. At block 506, the operations 500 continue by generating a digital signal segment (e.g., one of the digital signal segments 205) corresponding to the digital input signal based on the selected signal, and at block 508, generating an analog signal (segment) based on the digital signal segment. For example, the analog signal may correspond to the analog output provided by the summing amplifier 212 or an analog output segment at the output of one of the DAC elements of FIG. 2A.

In certain aspects, the operations 500 also include comparing (e.g., via comparison circuit 422) the first modulo output signal to zero. In this case, the selection of the first modulo output signal or the divisor input signal may be based on the comparison. In certain aspects, the selection of the first modulo output signal or the divisor input signal includes selecting the divisor input signal at most once across two consecutive sampling periods associated with the digital-to-analog conversion.

In certain aspects, generating the first modulo output signal may include generating a second modulo output signal (e.g., at node 410), and the digital signal segment may be generated at an output node. In this case, the operations 500 also include integrating (e.g., via the integrator 418) a signal present at the output node (e.g., output node Vout), subtracting a value of the divisor input signal from a value of the second modulo output signal (e.g., at node 410) to generate the first modulo output signal (e.g., at node 412), and selecting (e.g., via switch 404) the first modulo output signal or the second modulo output signal based on the integration. In certain aspects, the generation of the digital signal segment may be based on the selection of the first modulo output signal or the second modulo output signal.

In certain aspects, the operations 500 also include generating a difference signal (e.g., via the subtraction circuit 450) by subtracting a value of the digital signal segment from a value of the digital input signal, and generating a remainder signal by dividing (e.g., via the divider 452) a value of the subtraction signal by a value of the divisor input signal. In certain aspects, the remainder signal may be another digital signal segment of the digital input signal or may be used to generate the other digital signal segment of the digital input signal.

Figure 6:
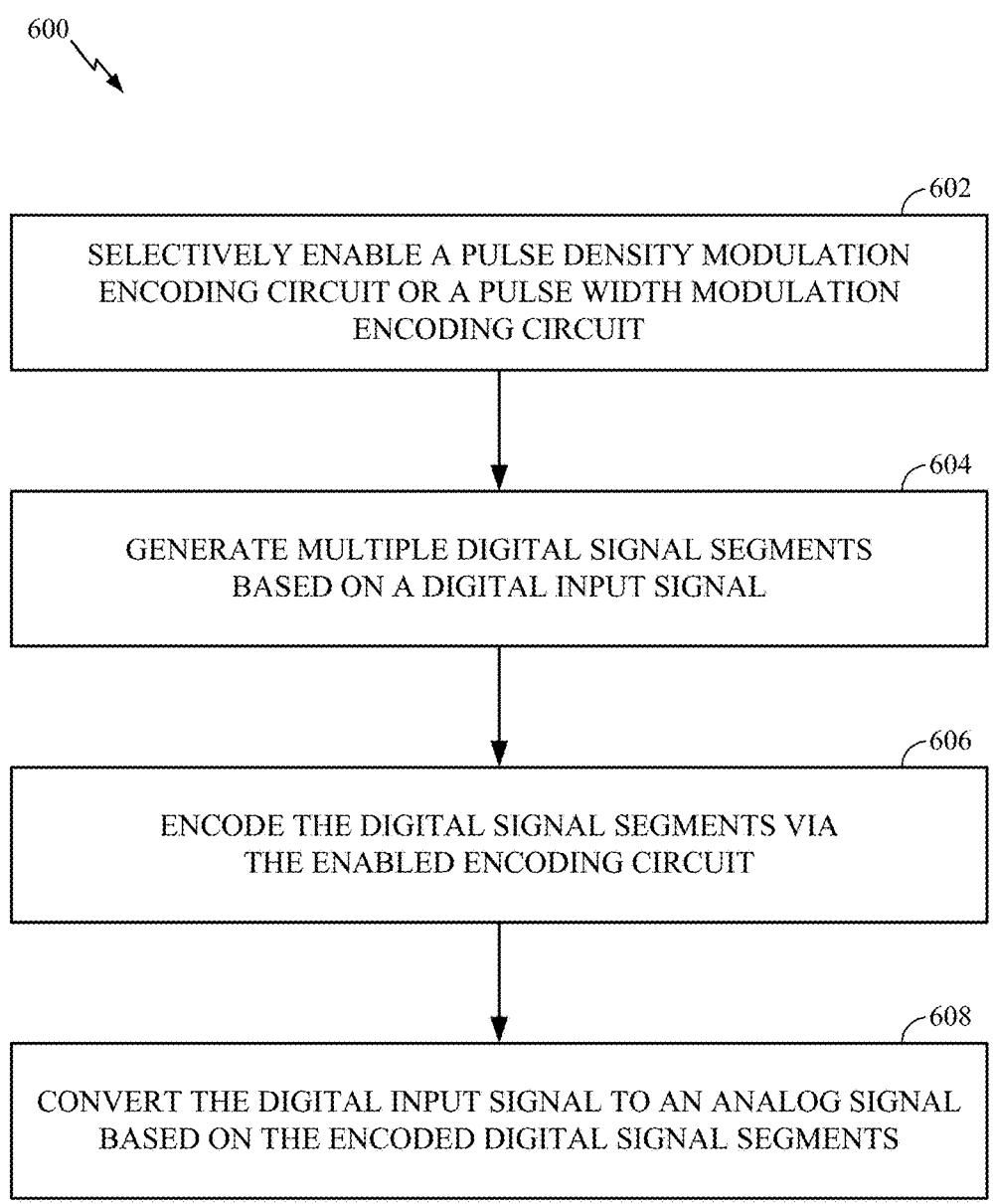
FIG. 6 is a flow diagram of example operations for digital-to-analog conversion, in accordance with certain aspects of the present disclosure.

FIG. 6 is a flow diagram of example operations 600 for digital-to-analog conversion, in accordance with certain aspects of the present disclosure. The operations 600 may be performed by a segmented DAC having a segmentation circuit, such as the DAC 200 having the segmentation circuit 204 as described with respect to FIGS. 2, 3 and 4.

The operations 600 may begin, at block 602, by selectively enabling a pulse-density modulation encoding circuit or a pulse-width modulation encoding circuit, and at block 604, generating multiple digital signal segments based on a digital input signal. For example, the generation of the multiple digital signal segments may be performed based on whether the pulse-density modulation encoding circuit or the pulse-width modulation encoding circuit is enabled. At block 606, the digital signal segments are encoded via the enabled encoding circuit, and at block 608, the digital input signal is converted to an analog signal based on the encoded digital signal segments.

In certain aspects, the operations 600 also include generating a modulo output signal based on the digital input signal and a divisor input signal, selecting the modulo output signal or the divisor input signal, and generating a first subset of the digital signal segments based on the selection. In this case, the encoding of the digital signal segments may include encoding the first subset of the digital signal segments and a second subset of the digital signal segments. In certain aspects, a gain of digital-to-analog conversion elements (e.g., DAC elements $210B_1$ to $210B_m$) used for the conversion of the encoded second subset of the digital signal segments corresponds to the divisor input signal, and a number of digital-to-analog conversion elements (e.g., DAC elements $210A_1$ to $210A_n$) used for the conversion of the encoded first subset of the digital signal segments corresponds to the divisor input signal. In certain aspects, the pulse-density modulation encoding circuit comprises dynamic element matching to reduce non-linear distortion associated with the analog signal.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A segmentation circuit for generating digital signal segments for a digital-to-analog converter, comprising:
   a modulo function logic circuit configured to generate a modulo output signal based on a digital input signal and a divisor input signal; and
   a modulo range extension logic circuit configured to selectively direct the modulo output signal or the divisor input signal to an output of the segmentation circuit, the output of the segmentation circuit to be used by the digital-to-analog converter to generate an analog signal based on the digital input signal.

2. The segmentation circuit of claim 1, wherein the modulo range extension logic circuit comprises a comparison circuit configured to compare the modulo output signal to zero, the modulo range extension logic circuit being configured to selectively direct the modulo output signal or the divisor input signal to the output of the segmentation circuit based on the comparison.

3. The segmentation circuit of claim 2, wherein:
   the modulo range extension logic circuit further comprises a first switch;
   the modulo range extension logic circuit is configured to selectively direct the divisor input signal to the output of the segmentation circuit via the first switch; and
   the first switch comprises a first input selectively coupled to a node configured to receive the divisor input signal and a second input selectively coupled to an output of the modulo function logic circuit.

4. The segmentation circuit of claim 3, wherein:
   the modulo range extension logic circuit further comprises a second switch;
   the first input of the first switch is selectively coupled to the node for receiving the divisor input signal via the second switch; and
   the second switch comprises a first input coupled to the node for receiving the divisor input signal and a second input coupled to a node having a constant value of zero, the second switch being configured to direct the first input or the second input of the second switch to the first input of the first switch based on the comparison.

5. The segmentation circuit of claim 4, wherein the modulo range extension logic circuit further comprises a control circuit configured to control the second switch such that the second switch is configured to direct the divisor input signal to the first input of the first switch at most once across two consecutive sampling periods of the digital-to-analog converter.

6. The segmentation circuit of claim 5, wherein the control circuit has an output coupled to a control input of the second switch, the control circuit comprising:
   another modulo function logic circuit having a divisor input coupled to a node having a constant value of two and an output coupled to the output of the control circuit;
   an adder having a first input coupled to an output of the comparison circuit and a second input coupled to an output of the other modulo function logic circuit; and
   a delay element having an input coupled to an output of the adder and an output coupled to a dividend input of the other modulo function logic circuit.

7. The segmentation circuit of claim 1, further comprising:
   a subtraction circuit configured to subtract a value at a first input of the subtraction circuit from a value at a second input of the subtraction circuit, wherein the first input is coupled to a node configured to receive the divisor input signal and the second input is coupled to an output of the modulo function logic circuit; and
   a switch having a first input coupled to an output of the subtraction circuit, a second input coupled to the output of the modulo function logic circuit, and an output selectively coupled to the output of the segmentation circuit.

8. The segmentation circuit of claim 7, further comprising:
   an integrator having an input coupled to the output of the segmentation circuit and having an output coupled to a control input of the switch.

9. The segmentation circuit of claim 1, further comprising:
   a subtraction circuit configured to subtract a value at a first input of the subtraction circuit from a value at a second input of the subtraction circuit, the first input being coupled to the output of the segmentation circuit and the second input being coupled to a node configured to receive the digital input signal; and
   a divider circuit configured to divide a value at a first input of the divider circuit by a value at a second input of the divider circuit, the first input being coupled to an output of the subtraction circuit and the second input being coupled to a node configured to receive the divisor input signal, the output of the divider circuit being coupled to a remainder output of the segmentation circuit.

10. A plurality of segmentation circuits for generating the digital signal segments for the digital-to-analog converter, wherein the plurality of segmentation circuits includes the segmentation circuit of claim 9 and wherein the remainder output is coupled to an input of another segmentation circuit of the plurality of segmentation circuits.

11. A digital-to-analog converter comprising:
a segmentation circuit configured to receive a digital input signal to be converted to an analog signal and generate multiple digital signal segments based on the digital input signal;
at least one pulse-density modulation encoder and at least one pulse-width modulation encoder coupled to outputs of the segmentation circuit; and
a plurality of digital-to-analog converter elements, wherein the pulse-density modulation encoder and pulse-width modulation encoder are coupled to the digital-to-analog converter elements and are configured to generate encoded signals based on the multiple digital signal segments and to provide the encoded signals to the digital-to-analog converter elements, the digital-to-analog converter elements being configured to generate the analog signal.

12. The digital-to-analog converter of claim 11, wherein the pulse-density modulation encoder and the pulse-width modulation encoder are selectively enabled to generate the encoded signals.

13. The digital-to-analog converter of claim 11, wherein:
the at least one pulse-density modulation encoder comprises a plurality of pulse-density modulation encoders, each coupled to a different subset of elements of the plurality of digital-to-analog converter elements; and
the at least one pulse-width modulation encoder comprises a plurality of pulse-width modulation encoders, each coupled to the different subset of elements of the plurality of digital-to-analog converter elements.

14. The digital-to-analog converter of claim 13, wherein gains corresponding to the digital-to-analog converter elements of each of the subsets are different from gains of digital-to-analog converter elements of other subsets of the plurality of digital-to-analog converter elements.

15. The digital-to-analog converter of claim 11, wherein the pulse-density modulation encoder is configured to generate the encoded signals using dynamic element matching to reduce non-linear distortion associated with the analog signal.

16. The digital-to-analog converter of claim 11, wherein the segmentation circuit comprises:
a modulo function logic circuit configured to generate a modulo output signal based on the digital input signal and a divisor input signal; and
a modulo range extension logic circuit configured to selectively direct the modulo output signal or the divisor input signal to an output of the segmentation circuit for providing a first segment of the digital signal segments.

17. The digital-to-analog converter of claim 16, wherein:
the at least one pulse-density modulation encoder comprises:
a first pulse-density modulation encoder configured to encode the first segment of the digital signal segments when the first pulse-density modulation encoder is enabled and selectively coupled to a first subset of the digital-to-analog converter elements; and
a second pulse-density modulation encoder configured to encode a second segment of the digital signal segments when the second pulse-density modulation encoder is enabled and selectively coupled to a second subset of the digital-to-analog converter elements; and
the at least one pulse-width modulation encoder comprises:
a first pulse-width modulation encoder configured to encode the first segment of the digital signal segments when the first pulse-width modulation encoder is enabled and selectively coupled to the first subset of the digital-to-analog converter elements; and
a second pulse-width modulation encoder configured to encode the second segment of the digital signal segments when the second pulse-width modulation encoder is enabled and coupled to the second subset of the digital-to-analog converter elements.

18. The digital-to-analog converter of claim 17, wherein:
a quantity of the first subset of the digital-to-analog converter elements corresponds to the divisor input signal; and
a gain of each of the second subset of the digital-to-analog converter elements corresponds to the divisor input signal.

19. A method for digital-to-analog conversion, comprising:
generating a first modulo output signal based on a digital input signal and a divisor input signal via a modulo function logic circuit;
selecting the first modulo output signal or the divisor input signal via a control circuit coupled to the modulo function logic circuit;
generating a digital signal segment corresponding to the digital input signal from the selected signal via one or more switches coupled to the control circuit; and
generating an analog signal based on the digital signal segment via a digital-to-analog converter circuit.

20. The method of claim 19, further comprising:
comparing the first modulo output signal to zero, wherein the selection of the first modulo output signal or the divisor input signal is based on the comparison.

21. The method of claim 19, wherein the selection of the first modulo output signal or the divisor input signal comprises selecting the divisor input signal at most once across two consecutive sampling periods associated with the digital-to-analog conversion.

22. The method of claim 19, wherein generating the first modulo output signal comprises generating a second modulo output signal, wherein the digital signal segment is generated at an output node, the method further comprising:
integrating a signal present at the output node;
subtracting a value of the divisor input signal from a value of the second modulo output signal to generate the first modulo output signal; and
selecting the first modulo output signal or the second modulo output signal based on the integration, wherein the generation of the digital signal segment is based on the selection of the first modulo output signal or the second modulo output signal.

23. The method of claim 19, further comprising:
generating a difference signal by subtracting a value of the digital signal segment from a value of the digital input signal; and
generating a remainder signal by dividing a value of the subtraction signal by a value of the divisor input signal.

24. The method of claim 23, wherein the remainder signal comprises another digital signal segment of the digital input signal or is used to generate the other digital signal segment of the digital input signal.

25. A method for digital-to-analog conversion comprising:
selectively enabling a pulse-density modulation encoding circuit or a pulse-width modulation encoding circuit;

generating multiple digital signal segments based on a digital input signal via a segmentation circuit;

encoding the digital signal segments via the enabled encoding circuit; and converting the digital input signal to an analog signal based on the encoded digital signal segments via a digital-to-analog converter circuit.

26. The method of claim 25, wherein the generation of the multiple digital signal segments is based on whether the pulse-density modulation encoding circuit or the pulse-width modulation encoding circuit is enabled.

27. The method of claim 25, further comprising:

generating a modulo output signal based on the digital input signal and a divisor input signal;

selecting the modulo output signal or the divisor input signal; and generating a first subset of the digital signal segments based on the selection.

28. The method of claim 27, wherein:

the encoding of the digital signal segments comprises encoding the first subset of the digital signal segments and a second subset of the digital signal segments;

a gain of digital-to-analog conversion elements used for the conversion of the encoded second subset of the digital signal segments corresponds to the divisor input signal; and a number of digital-to-analog conversion elements used for the conversion of the encoded first subset of the digital signal segments corresponds to the divisor input signal.

29. The method of claim 25, wherein the pulse-density modulation encoding circuit comprises dynamic element matching to reduce non-linear distortion associated with the analog signal.

* * * * *